(12) United States Patent
Chung et al.

(10) Patent No.: US 6,665,193 B1
(45) Date of Patent: Dec. 16, 2003

(54) ELECTRONIC CIRCUIT CONSTRUCTION, AS FOR A WIRELESS RF TAG

(75) Inventors: Kevin Kwong-Tai Chung, Princeton, NJ (US); William Lewis Sked, Mercerville, NJ (US)

(73) Assignee: Amerasia International Technology, Inc., Princeton Junction, NJ (US)

( * ) Notice: Subject to any disclaimer, the term of this patent is extended or adjusted under 35 U.S.C. 154(b) by 0 days.

(21) Appl. No.: 10/191,580

(22) Filed: Jul. 9, 2002

(51) Int. Cl.[7] .................................................. H05K 7/10
(52) U.S. Cl. ........................ 361/760; 361/720; 361/748; 257/787; 257/678; 257/679; 174/257
(58) Field of Search ................................ 361/760, 679, 361/772, 777, 737, 809, 720, 719, 736, 749; 257/787, 678, 679; 174/257

(56) References Cited

U.S. PATENT DOCUMENTS

| | | | |
|---|---|---|---|
| 5,519,201 A | 5/1996 | Templeton, Jr. et al. | |
| 5,598,032 A | 1/1997 | Fidalgo | |
| 5,767,503 A | 6/1998 | Gloton | |
| 5,880,934 A | 3/1999 | Haghiri-Tehrani | |
| 6,091,332 A | * 7/2000 | Eberhardt et al. | 340/572.1 |
| 6,100,804 A | 8/2000 | Brady et al. | |
| 6,107,920 A | * 8/2000 | Eberhardt et al. | 340/572.7 |
| 6,384,727 B1 | * 5/2002 | Diprizio et al. | 340/572.7 |
| 6,496,113 B2 | * 12/2002 | Lee et al. | 340/572.7 |
| 6,606,247 B2 | * 8/2003 | Credelle et al. | 361/737 |

\* cited by examiner

*Primary Examiner*—David Martin
*Assistant Examiner*—Hung Bui
(74) *Attorney, Agent, or Firm*—Dann, Dorfman, Herrell & Skillman, P.C.

(57) ABSTRACT

An electronic circuit arrangement comprises a substrate having an electrical conductor thereon, wherein the electrical conductor includes two contacts spaced apart substantially a predetermined distance; an electronic jumper having two contacts spaced apart substantially the predetermined distance and respectively connected to the two contacts of the substrate; and an electronic device on the electronic circuit jumper and having two contacts respectively connected to the two contacts of the electronic circuit jumper.

35 Claims, 4 Drawing Sheets

ELECTRONIC CIRCUIT CONSTRUCTION, AS FOR A WIRELESS RF TAG

The present invention relates to an electronic circuit, and, in particular, to a construction therefor.

Electronic identification and tracking of articles, persons, transactions and the like is becoming more prevalent, and the identification devices that include an electronic device utilized for such identification and tracking are variously referred to as smart tags, smart cards, RF tags, RFID tags, wireless cards, wireless tags, contact cards and tags, and the like. Identification devices for certain utilizations such as credit cards, debit cards, cash cards, driver's licenses, are of controlled size and often are relatively rigid and/or inflexible.

A prior art wireless tag includes a spiral antenna on a substrate and an electronic device, typically an electronic chip or integrated circuit, connected to an antenna. Where the antenna has only one or two turns or loops, the electronic device may be mounted directly over and straddling the antenna because the distance between the contacts of the electronic device is greater than the distance between the terminals of the antenna. An example thereof is illustrated in FIGS. 15–16 of U.S. Pat. No. 6,404,643 issued Jun. 11, 2002, to Kevin Kwong-Tai Chung.

In a more common example, however, owing to a larger number of turns or loops of the spiral antenna and/or of the width and spacing thereof, the distance between the antenna terminals is substantially greater than is the spacing of the contacts of the electronic device. Connection across antenna 20 may be a conductor on the opposite side of substrate 12, as illustrated, for example, in FIGS. 2, 3A–3B and 6–8 of U.S. Pat. No. 6,353,420 issued Mar. 5, 2002, to Kevin Kwong-Tai Chung.

For many "high-volume" or "high-quantity" utilizations, however, such as product tags, inventory tags, anti-theft tags, laundry tags, baggage tags and the like, the tags may be used only one or two times before being discarded. The tags described in the aforementioned U.S. patents are very suitable for such utilizations, but are usually much more durable and robust than is necessary for single-use tags. Other prior art tags tend to employ multiply-layered substrates, complicated connection and interconnection arrangements, and the like, which tend to make them too expensive for use in a tag that is disposed of after only one or two uses.

The cost of the identification tag could be reduced if a thinner, more flexible and inexpensive substrate were to be used. One significant problem associated with a thinner, more flexible substrate material is that it lacks the "dimensional stability" of the thicker higher-cost substrate materials and tends to curl and ripple rather than remaining planar or "flat" as do stiffer substrates. As a result, it becomes very difficult to place and solder electronic devices on such thin, flexible substrate materials with sufficient accuracy of contact registration to consistently produce acceptable identification devices, even when highly accurate "pick-and-place" automated assembly equipment is utilized. This problem becomes worse when making tags having different sizes and configurations, particularly smaller tags.

Accordingly, an electronic circuit arrangement for an identification tag employing a thin, flexible substrate would be desirable. In addition, it would be desirable that such arrangement could utilize automated assembly, and yet could still be of sufficiently low cost as to be disposable.

To this end, the electronic circuit of the present invention comprises an electronic jumper having two contacts spaced apart substantially the predetermined distance, and an electronic device on the electronic jumper and having two contacts respectively connected to the two contacts of the electronic jumper.

According to another aspect, an electronic article comprises a substrate having an electrical conductor thereon, wherein the electrical conductor includes two contacts spaced apart substantially a predetermined distance, an electronic jumper having two contacts spaced apart substantially the predetermined distance and respectively connected to the two contacts of the substrate; and an electronic device on the electronic jumper and having two contacts respectively connected to the two contacts of the electronic jumper.

BRIEF DESCRIPTION OF THE DRAWING

The detailed description of the preferred embodiments of the present invention will be more easily and better understood when read in conjunction with the FIGURES of the Drawing which include.

In the Drawing, where an element or feature is shown in more than one drawing figure, the same alphanumeric designation may be used to designate such element or feature in each figure, and where a closely related or modified element is shown in a figure, the same alphanumerical designation primed may be used to designate the modified element or feature. It is noted that, according to common practice, the various features of the drawing are not to scale, and the dimensions of the various features may be arbitrarily expanded or reduced for clarity.

DESCRIPTION OF THE PREFERRED EMBODIMENT(S)

Figure 1:
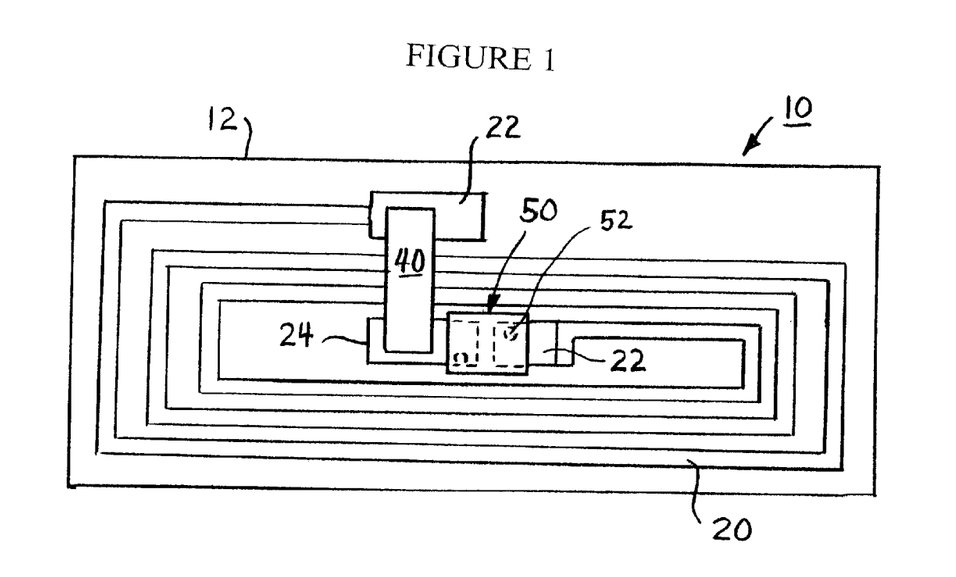
FIG. 1 is a plan view of an RF tag employing an electronic device and an electrical jumper.

FIG. 1 shows an example of an RF wireless tag 10. Tag 10 includes a spiral antenna 20 on a substrate 12 having antenna terminals 22. Terminals 52 of electronic device 50, typically an electronic chip or integrated circuit 50, are too close together to be connected to terminals 22 of antenna 20. To connect across the turns of antenna 20, an electrical "jumper" conductor 40 is utilized. Jumper 40 includes a dimensionally-stable substrate having an electrical conductor thereon and is on the same side of substrate 12 as is antenna 20, as shown in FIG. 1, and that connects a contact 24 to one antenna terminal 22. Contacts 52 of electronic device 50 are respectively connected to conductor 24 and to another of antenna terminals 22.

Figure 2A:
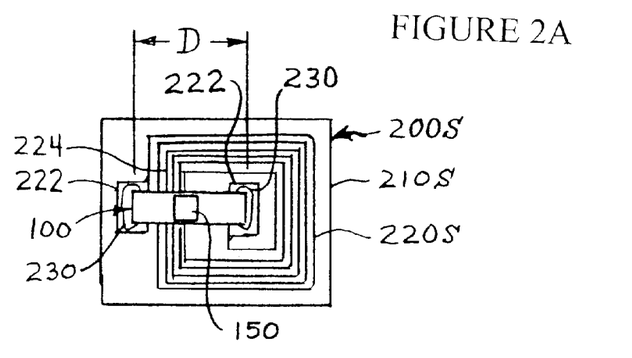
FIGS. 2A, 2B and 2C are plan views of three example embodiments of a circuit arrangement each including an electronic device on an electronic circuit jumper.
Figure 2B:
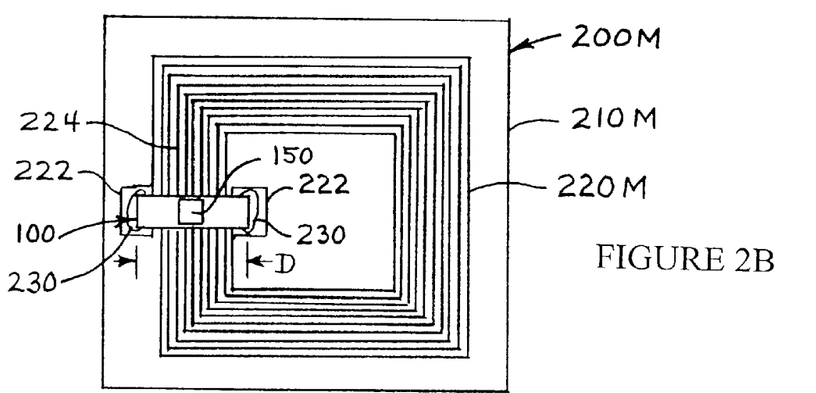
Figure 2C:
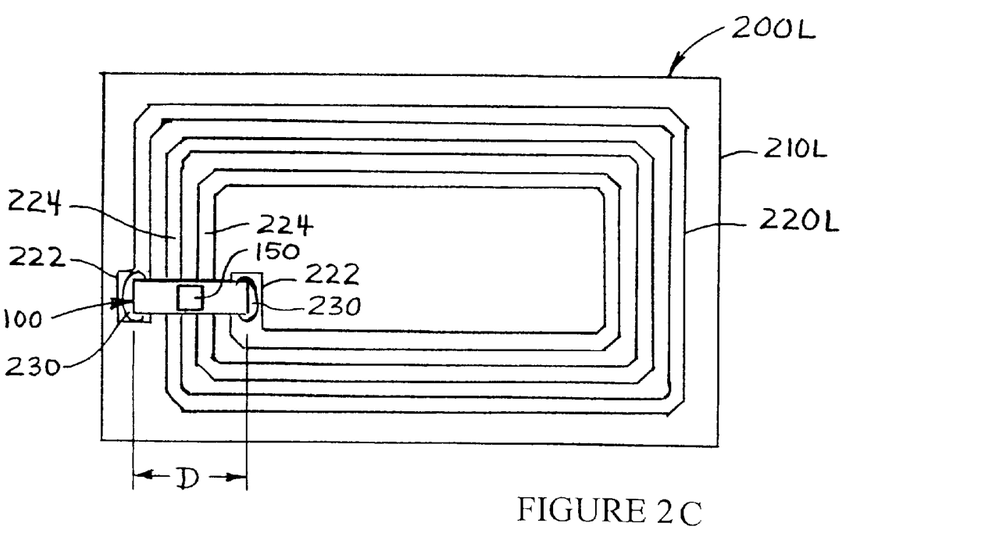

FIGS. 2A, 2B and 2C are plan views of three example embodiments 200S, 200M and 200L of an electronic circuit arrangement each including an electronic device 150 on an electronic circuit jumper 100 (also referred to herein as electronic circuit 100). In general, articles 200S, 200M, 200L comprise a set of articles of different sizes and/or shapes wherein each article includes an electronic circuit 100 of the same size, and wherein each electronic circuit 100 includes an electronic device 150. The number of articles that comprise the set may be any number, e.g., two or greater, and the number of different sizes and/or shapes of the articles in a set may be any number, e.g., one or greater. For example, the set of articles illustrated by FIGS. 2A–2C includes three different articles representing three different sizes and shapes. In general, the electronic circuits 100 of each of the articles of a set of articles are the same length, i.e. their longer dimension is the same predetermined distance D between the opposite ends of circuit 100.

In general, the illustrated articles 200S, 200M, 200L comprise wireless articles each including an antenna 220 operatively coupled to an electronic device 150, as might be employed in a smart tag or card, credit or debit card, identification badge or tag, and/or other wireless article, that may be utilized in any one or more environments, such as, for example, financial, commercial and/or other business transactions, article identification and/or tracking, personnel tracking and/or identification, access control, registration, voting, security, inventory, and the like.

In particular, article 200S comprises a relatively smaller-size wireless article 200S having a relatively smaller size substrate 210S on a surface of which is a relatively smaller size spiral antenna 220S having terminals 222 and having a number of turns or loops 224. Terminals 222 are spaced apart a predetermined distance D, typically with turns of antenna 220 lying therebetween. A standard size electronic circuit 100 is mounted to substrate 210S, specifically by a solder or electrically-conductive adhesive connection 230 to terminals 222 of antenna 220S. Electronic circuit 100 includes electronic device 150 which is operatively connected to the opposing ends of electronic circuit 100 whereat connections are made to antenna 220S via solder or conductive adhesive 230.

Similarly, article 200M comprises a relatively medium-size wireless article 200M having a relatively medium size substrate 210M on a surface of which is a relatively medium size spiral antenna 220M having terminals 222 and having a number of turns or loops 224. Terminals 222 are spaced apart the predetermined distance D, typically with turns of antenna 220 lying therebetween. The standard size electronic circuit 100 is mounted to substrate 210M, specifically by solder or electrically-conductive adhesive 230 to terminals 222 of antenna 220M. Electronic circuit 100 includes electronic device 150 which is operatively connected to the opposing ends of electronic circuit 100 whereat connections are made to antenna 220M via solder or conductive adhesive 230.

Also similarly, article 200L comprises a relatively larger-size wireless article 200S having a relatively larger size substrate 210L on a surface of which is a relatively larger size spiral antenna 220L having terminals 222 and having a number of turns or loops 224. Terminals 222 are spaced apart the predetermined distance D, typically with turns of antenna 220 lying therebetween. The standard size electronic circuit 100 is mounted to substrate 210L, specifically by solder or electrically-conductive adhesive 230 to terminals 222 of antenna 220L. Electronic circuit 100 includes electronic device 150 which is operatively connected to the opposing ends of electronic circuit 100 whereat connections are made to antenna 220L via solder or conductive adhesive 230.

Preferably, all of electronic circuits 100 are the same length, i.e. the distance between the respective opposing ends thereof that connect to terminals 222 of antenna 220 (e.g., to antenna 220S, 220M and/or 220L), which length is the predetermined distance D. Preferably, the pair of terminals 222 of each substrate 200 (e.g., substrate 200S, 200M and/or 200L) are "spaced apart by a predetermined distance" D so that the ends of electronic circuit 100 will always be connectable thereto, e.g., by solder or conductive adhesive. Thus, the spacing between pairs of terminals 222 and the size of terminals 222 are such that, with the tolerances of the size and positioning of terminals 222, the ends of standard electronic circuit 100 will be connectable thereto. I.e. when one end of a standard electronic circuit 100 is placed in any location on a terminal 222, the other end thereof will be somewhere on the corresponding terminal 222 so that connection may be made thereto.

To this end, it is preferred that electronic circuit 100 include a substrate of a dimensionally stable material, irrespective of whether or not substrate 210 is a dimensionally stable material. Thus, an advantage obtains if substrate 210 is a thin, flexible, elastic and/or low cost material that does not have sufficient dimensional stability to allow an electronic device 150 having relatively small contacts 152 to be attached to corresponding contacts thereon reliably and consistently by automated pick-and-place equipment. Because the substrate of electronic circuit 100 is of a dimensionally stable material, an electronic device 150 may be properly placed thereon and the relatively smaller contacts of electronic device 150 may be properly connected thereto, such as by soldering, using automated pick-and-place equipment. Then electronic circuit 100 may also be properly placed on and connected to relatively larger contact sites on substrate 210 using automated pick-and-place equipment even though the positions and dimensions of the contact sites of substrate 210 may have a greater dimensional tolerance.

As used herein, a material is said to have "dimensional stability" or to be a "dimensionally stable material" if it or a substantial component of it has a glass transition temperature $T_g$ that is higher than the temperature to which it must be raised in processes utilized in making the circuit arrangement described herein. If the $T_g$ of a material is greater than the processing temperature, the material does not soften or melt during the processing and so it will retain its shape and size. If the material softens or melts, then the locations of features thereon may move by an amount that is too great to maintain the tolerances required by the process or the material may ripple, distort or otherwise lose planarity.

For example, where a material undergoes a soldering operation it must be dimensionally stable during soldering, so that the locations of sites to be soldered maintain their locations to within a tolerance that is compatible with the size of the sites and the item to be soldered thereto. In soldering, the material is raised to a temperature that is higher than the melting temperature of solder, i.e. to greater than about 220° C. for a typical solder (although various types of solders may have higher or lower melting temperatures, e.g., in the range of about 200–250° C.). Where electronic devices are reflow soldered to an electronic substrate or circuit board, the temperature is raised to about 220–250° C. in order to melt and reflow the solder. Because typical electronic devices such as integrated circuit chips have contact pads that are only a few thousandths of an inch in size, the contact sites to which they are soldered must be located to within a few thousandths of an inch. One one-thousandth of an inch is also known as one mil.

A material that undergoes a soldering operation will be dimensionally stable at the melting temperature of solder if, for example, its $T_g$ is greater than about 250° C. One example of such dimensionally stable material is polyimide which has a $T_g$ of about 350° C. A material that undergoes a soldering operation will also be dimensionally stable at the melting temperature of solder if, for example, the $T_g$ of a substantial component thereof is greater than about 250° C. One example of such dimensionally stable material is FR4 fiberglass reinforced epoxy which includes reinforcing glass fibers that have a $T_g$ in excess of about 800° C.

When electronic devices are to be placed onto a substrate by pick-and-place equipment and soldered to the substrate, the contact sites thereon must be in known positions to within a tolerance about 2–3 mils, even for a relatively large substrate, e.g., a substrate that is 6×6 inches or 12×12 inches in size. Polyimnide, FR4 fiberglass reinforced epoxy, and liquid crystal polymer materials are examples of electronic substrate materials that can maintain such tolerances in soldering processes. Positional changes of contact sites on a substrate of a material that is not dimensionally stable may change by as much as 10–20 mils, which is greater than the size of the contact pads of the electronic devices. As a result, the electronic devices will be improperly placed on the substrate and will yield inoperable or reject product.

Figure 3:
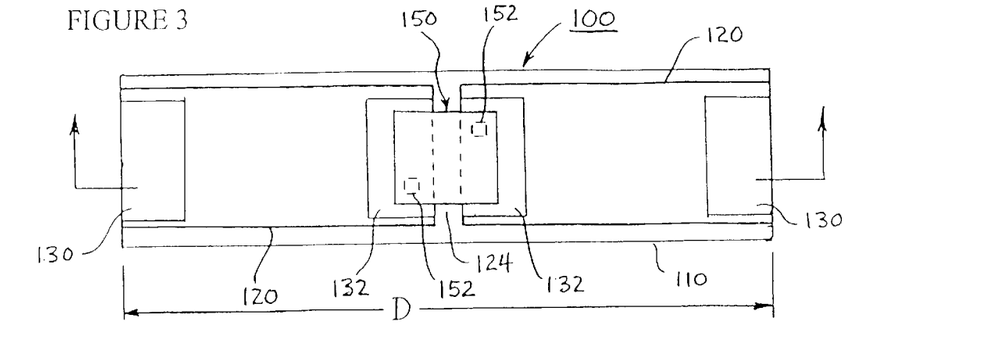
FIGS. 3 and 4 are a plan view and a side cross-sectional view, respectively, of an example embodiment of the electronic circuit jumper of FIGS. 2A–2C.
Figure 4:
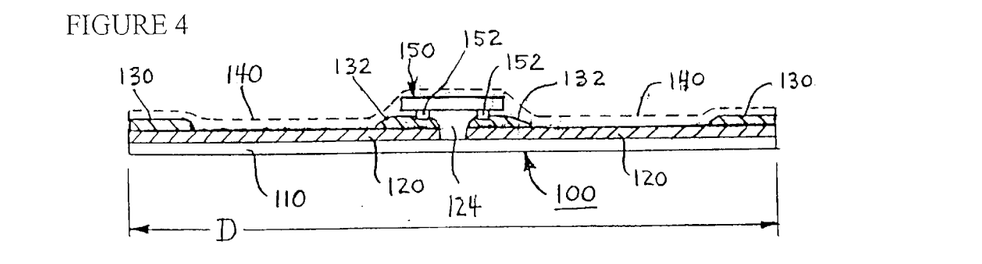

FIGS. 3 and 4 are a plan view and a side cross-sectional view of an example embodiment of the electronic circuit jumper 100 of FIGS. 2A–2C. Electronic circuit 100 comprises a substrate 110 preferably of a dimensionally stable material such as polyimide, of predetermined length D. A conductor layer on substrate 110 is patterned, e.g., a copper layer patterned by etching, to define conductors 120 each extending from an opposing end of substrate 110 toward the central region thereof to define a space or gap 124. Solder 130 is on an area of each conductor 120 at each end of substrate 110. Solder 132 on an area at the end of each conductor 120 proximate gap 124 is reflowed to electrically connect contacts 152 of electronic device 150 to conductors 120.

Electronic device may be an integrated circuit, semiconductor chip, flip chip device, surface-mount device, diode(s), transistor(s), or any other electronic device or component. The areas of solder 130, 132 are sized to be sufficient for making reliable electrical connections as described, and the gap 124 between conductors 120 is sized to be less than the spacing between contacts 152 of electronic device 150.

An example electronic circuit 100 includes a substrate 110 of polyimide that is 0.10 inch wide and 0.40 inch in length, and is one mil thick. Substrate 110 is typically in the range of ½ to 2-mils thick. Conductors 120 thereof are 0.08 inch wide by 0.19 inch in length, thereby to define a gap 124 of 0.02 inch. Conductors 120 are "one-ounce copper" which is about 1.4 mils thick, but may be of "½-ounce copper" which is about 0.7 mil thick, or may be of any other suitable conductor material and thickness. A suitable copper-clad polyimides include KAPTON® polyimide and PYRALUX® polyimide available from E.I. duPont de Nemoirs and Company, located in Wilmington, Del.

Solder 130 and 132 are preferably screen printed solder paste of about 0.07 by 0.04 inch size, such as the types R562 and EasyProfile™ 256 "no-clean" solder pastes available from Kester Solder Company located in Des Plaines, Illinois, and the types NC559AS and "Syntech" "no-clean" solder creams available from Amtech Advanced SMP Solder Products located in Branford, Conn., and are reflowed when electronic device 150 is attached to substrate 110.

Electronic circuit 100 may include an optional insulating cover layer 140, such as of type CB7130 or type CB7160 thermoplastic adhesive, or of type MEE7650 thermosetting adhesive, or of type UVA3150 ultraviolet curing adhesive, all of which are available from AI Technology, Inc., located in Princeton Junction, N.J. Optional insulating layer 140 may be applied by any suitable method, such as by screen printing, other printing, mask deposition, roll coating, sheet laminating, and the like.

Figure 5:
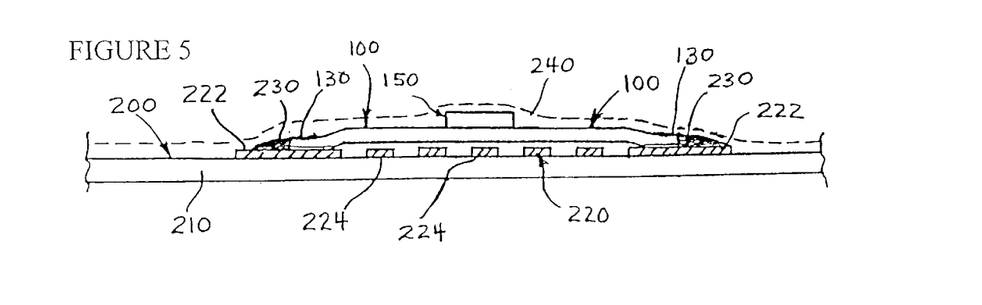
FIGS. 5 and 6 are cross-sectional views of alternative example mounting arrangements of the electronic circuit jumper of FIGS. 3 and 4 on the circuit arrangements of FIGS. 2A–2C.
Figure 6:
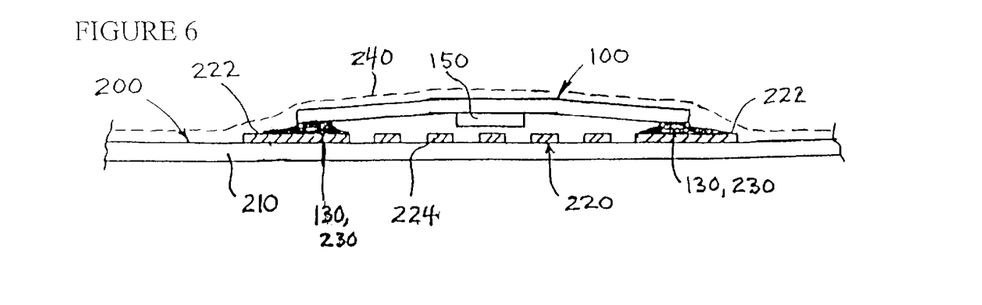

FIGS. 5 and 6 are cross-sectional views of alternative example mounting arrangements of the electronic circuit jumper 100 of FIGS. 3 and 4. In FIG. 5, electronic circuit jumper 100 spans turns 124 of antenna 220 on substrate 210 of wireless article 200 to connect to terminals 222 of antenna 220 with electronic device 150 on the side (surface) of jumper 100 facing away from substrate 210. Electronic circuit 100 is placed with its ends into solder paste 230 on terminals 222. When heat is applied, solder 230 on terminals 222 of substrate 210 and solder 130 on conductors 120 of jumper 100 reflow to make electrical connection between conductors 120 of jumper 100 and terminals 222 of antenna 220.

In FIG. 6, electronic circuit jumper 100 spans turns 124 of antenna 220 on substrate 210 of wireless article 200 to connect to terminals 222 of antenna 220 with electronic device 150 on the side (surface) of jumper 100 facing towards substrate 210. Electronic circuit 100 is placed with solder 130 at its ends against solder paste 230 on terminals 222. When heat is applied, solder 230 on terminals 222 of substrate 210 and solder 130 on conductors 120 of jumper 100 reflow to make electrical connection between conductors 120 of jumper 100 and terminals 222 of antenna 220.

Optionally, a covering layer 240 of insulating material may be applied over substrate 210 and electronic circuit 100, e.g., employing any of the materials and methods described above in relation to layer 140 of circuit 100. Substrate 210 may be of any insulating material suitable for an electronic substrate, such as polyimide, FR4 and liquid crystal polymers. Typically, substrate 210 may be about 1–10 mils thick. One suitable substrate material is type ESP7450 flexible thermosetting adhesive available from AI Technology, which is preferred for a thin, e.g., 3-mil thick, flexible substrate that can be made at low cost. An ESP7450 substrate is not dimensionally stable for soldering operations, and so an electronic circuit 100 having a polyimide substrate 110 is typically utilized therewith.

Figure 7A:
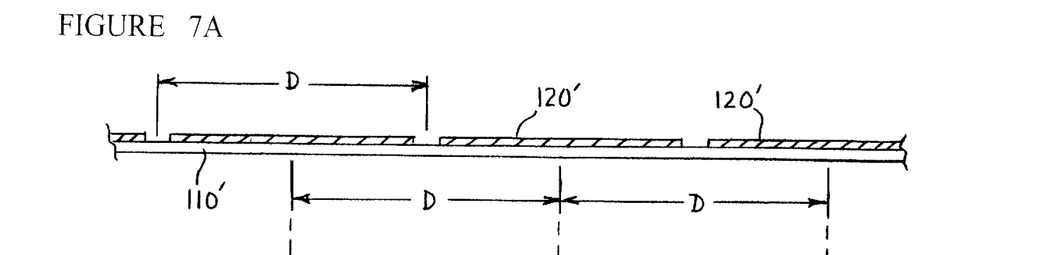
FIGS. 7A, 7B and 7C are cross-sectional views illustrating steps in the making of the electronic circuit arrangement of FIGS. 3–4.
Figures 7B, 7C:
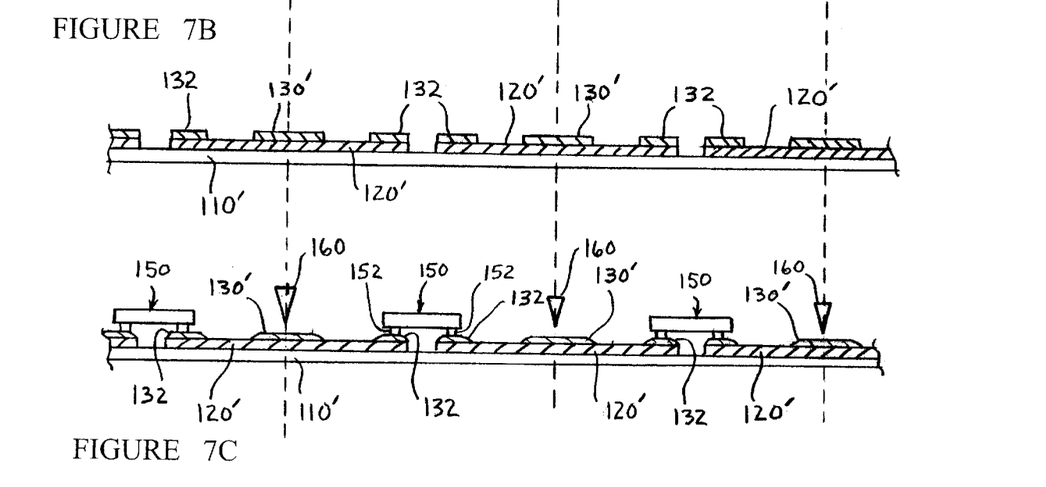

FIGS. 7A–7C are cross-sectional views illustrating steps in the making of the circuit arrangement 100 of FIGS. 3–4, and in particular, making a plurality of electronic circuits 100 from a sheet of substrate material 110.

In FIG. 7A, a sheet of an electrical jumper substrate material 110' preferably of a dimensionally stable insulating material, such as one-mil thick polyimide, is provided with a conductor layer 120' thereon, such as one-ounce copper. The conductor layer is patterned, such as by conventional copper etching process, to provide a plurality of elongated conductors 120' thereon. The pitch of the elongated conductors 120' is a predetermined distance wherein "D" designates the predetermined distance. The substrate 110 material may be a sheet, for example a 12-inch by 12-inch sheet, or may be a roll of substrate material 12-inches wide. Typically, the 12-inch wide substrate material 110' will permit about 26–27 patterns that will produce an electronic circuit 100 of 0.4-inch length to be made across the width thereof. Each 6-inch length of substrate material 110' typically will permit about 58–60 patterns of electronic circuit 100 of 0.1-inch width to be made therefrom.

In FIG. 7B, a pattern of solder paste 130' and 132 is deposited on each of the elongated conductors 120', wherein the pattern of solder paste includes at least areas of solder paste 132 at opposite distal ends of each elongated conductor 120' and an area of solder paste 130' central to each elongated conductor 120'. Typically, each area of solder paste 130' is 0.07 inch by 0.08 inch and each area of solder paste 132 is 0.07 inch by 0.04 inch, and both are typically about 2–10 mils thick, and preferably about 4–6 mils thick. The terms "solder paste" and "solder cream" are names for solder-containing products that can be applied in various ways such as by screen printing, mask deposition, printing, blade-spreading, and the like.

In FIG. 7C, a plurality of electronic devices 150 are placed on the electrical jumper substrate 110' with first and second contacts 152 of each electronic device 150 abutting the pattern of solder paste 132 at adjacent distal ends of adjacent ones of the plurality of elongated conductors 120'. The solder paste 130', 132 is processed to electrically connect the first and second contacts 152 of each electronic device 150 to the adjacent elongated conductors 120' of the electrical jumper substrate 110'. Processing the solder paste 130', 132 includes heating at least solder paste 132 to at least the melting temperature of the solder so that solder paste 132 flows to form electrical connections of contacts 152 and conductors 120', however, solder paste 130' may also be heated and reflow on conductors 120'.

Also in FIG. 7C, but following attachment of electronic devices 150 as described, the electronic jumper substrate 110' is separated into individual jumpers 100, including dividing each elongated conductor 120' at the central area of solder 130' thereon. Preferably, the separation is performed by die cutting represented by cutting die 160 spaced apart by the predetermined distance "D" to divide substrate 110', conductor 120' and solder 130' substantially at the center of conductor 120' and solder 130'. As a result, each individual jumper 100 includes first and second elongated conductor 120 portions and one electronic device 150 having first and second contacts 152 respectively connected to first and second conductor portions 120, as shown in FIG. 4. Further, the divided central solder 130 area of the first and second electrical conductor portions 120 of each individual jumper 100 are adjacent respective edges of the individual jumper 100, and each individual jumper 100 has one dimension that is substantially the predetermined distance "D."

Also preferably, the die-cutting die 160 employed to separate substrate 110' into individual articles 100 is directed into the solder 130 side of substrate 110 and conductors 120 so that the cut edge thereof will tend to have the solder 130 deformed over a deformed conductor 120 and substrate 110. This tends to facilitate soldering to terminals 222 of conductor pattern 220, particularly when jumper 100 is mounted in the arrangement shown in FIG. 5.

Figure 8:
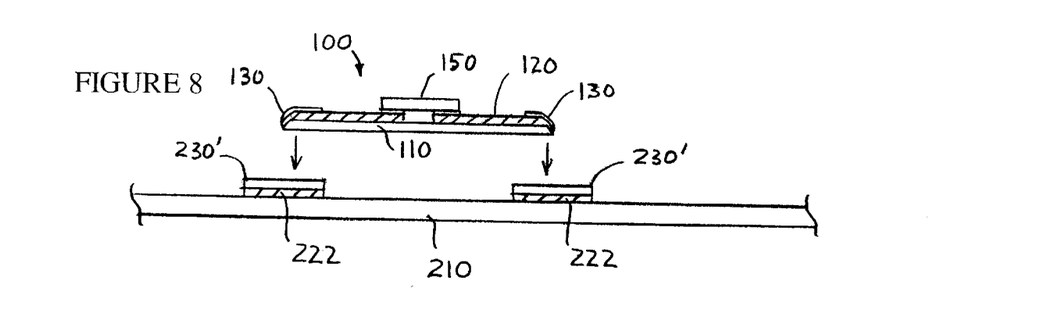
FIG. 8 is a cross-sectional view illustrating a step in the making of the circuit arrangement of FIGS. 2A–2C, 5 and/or 6.

FIG. 8 is a cross-sectional view illustrating a step in the making of the circuit arrangement 200 of FIGS. 2A–2C, 5 and/or 6. An insulating substrate 210 is provided having an electrical conductor pattern 220 thereon. Solder paste 230' is applied on the terminals 222 of the conductor pattern 220, preferably of a thickness at least as great as the combined thicknesses of substrate 110 and conductor 120 of electronic circuit 100. An individual circuit jumper 100 is then mounted to an insulating substrate 210 with the divided central solder 130 areas of the first and second elongated conductor portions 120 of the individual jumper 100 electrically connecting with first and second contact sites 222 of one electrical conductor pattern of the electronic substrate 210. Typically, solder 130 and solder 230 flow together when they are melted, as in a reflow soldering process.

Preferably, a plurality of articles 200 are produced substantially contemporaneously from an insulating substrate 210 on which are provided a plurality of conductor patterns 220 each having terminals 222. Typically a 12-inch wide insulating substrate material is provided, and it may be a sheet of convenient length, such as a 12-inch long sheet, or may be a longer rolled sheet or strip. A 12-inch by 12-inch insulating substrate can be utilized to provide, for example, an 11 by 12 array of individual substrates 210 of about 1 by 1 inch size, or a 7 by 8 array of individual substrates 210 of about 1.5 by 1.5 inch size, a 3 by 5 array of individual substrates 210 of about 3.6 by 2.25 inch size. One suitable substrate material includes a 3-mil thick sheet of type ESP7450 flexible insulating thermosetting adhesive also available from Al Technology, which adhesive sheet is flexible and stretchy, and so is not dimensionally stable for soldering electronic devices directly thereto. Typical substrates are in the range of about 1 to 10 mils thick.

Where a sheet of insulating substrate material 210 is utilized, following the mounting of an individual jumper to each conductive pattern thereon, the insulating substrate 210 is separated into individual electronic articles 200, wherein each individual electronic article 200 includes one conductor pattern 220 and one individual jumper 100 connected thereto. Separating of the insulating substrate 210 into individual articles 200 may be by die cutting or any other convenient method.

The embodiments described generally employ solder for electrical connections between the tag substrate 210 terminals 222 and conductors 120, and between conductors 120 and contacts 152 of electronic device 150, however, such connections could be made by an electrically conductive adhesive. Such electrically-conductive adhesive could be applied in a liquid form or in a solid form, for example, by screen printing, mask deposition, preform transfer, lamination, or any other suitable method. Suitable electrically conductive adhesives include, for example, type LTP8150 liquid flexible-thermoplastic conductive adhesive, type ESP8650 flexible electrically-conductive thermosetting adhesive, types ESS8450 (silver filler), ESS8456 (silver-palladium alloy filler), ESS8457 (gold-plated copper filler), ESS8458 (gold powder filler) and ESS8459 (gold-plated nickel filler) flexible epoxy-based adhesive pastes and types PSS8156 (silver-palladium alloy filler), PSS8157 (gold-plated copper filler), PSS8158 (gold powder filler) and PSS8159 (gold-plated nickel filler) flexible paste adhesives, all of which are commercially available from AI Technology, Inc. of Princeton Junction, N.J. and type CB025 electrically conductive ink available from E.I. dupont de Nemoirs and Company, located in Wilmington, Del. Processing the electrically-conductive adhesive may include one or more of drying, B-staging, melt flowing, tacking, curing, heat curing, and the like. Preferably, the contacts to which electrically conductive adhesive is applied are plated or otherwise coated with gold, platinum, silver, nickel, or other precious or noble metal that resists oxidation and/or corrosion.

As used herein, the term "about" means that dimensions, sizes, formulations, parameters, shapes and other quantities and characteristics are not and need not be exact, but may be approximate and/or larger or smaller, as desired, reflecting tolerances, conversion factors, rounding off, measurement error and the like, and other factors known to those of skill in the art. In general, a dimension, size, formulation, parameter, shape or other quantity or characteristic is "about" or "approximate" whether or not expressly stated to be such. The terms "electrical" substrate and "electronic" substrate are considered to be interchangeable.

While the present invention has been described in terms of the foregoing exemplary embodiments, variations within the scope and spirit of the present invention as defined by the claims following will be apparent to those skilled in the art. For example, while the examples of tag substrates 210 and of jumper substrates 110 are illustrated as rectangular, other shapes may be employed as is desired and as may be convenient or necessary in a given utilization. Similarly, while the examples of conductors 120, of contacts 130, 132, 222, and of the applied solder/conductive adhesive areas 130, 132, 230 are illustrated as rectangular, they may be square or circular or of any desired shape.

Further, while the electronic device 150 is shown as connected at opposing ends of a gap in an electrical conductor 20, 120, two or more contacts or a pattern of two or more contacts may be provided for making two or more connections thereto.

What is claimed is:

1. A set of electronic articles, wherein each electronic article need not be of the same size and/or shape, each electronic article comprising:
    a substrate having an electrical conductor thereon, wherein the electrical conductor includes two contacts spaced apart substantially a predetermined distance, wherein said substrate need not be a dimensionally stable material;
    an electronic jumper having two contacts spaced apart substantially the predetermined distance and respectively connected to the two contacts of the substrate, wherein said electronic jumper includes a jumper substrate of a dimensionally stable substrate material; and
    an electronic device on said electronic jumper and having two contacts respectively connected to the two contacts of said electronic jumper,
    whereby, for each electronic article of the set, the electronic device is on and connected to said electronic jumper which is on and connected to the electrical conductor of said substrate.

2. The set of electronic articles of claim 1 wherein the electrical conductor on said substrate includes an elongated conductor providing an antenna, whereby said electronic article is a wireless article.

3. The set of electronic articles of claim 1 wherein said jumper substrate has a length substantially the predetermined distance, and wherein said two contacts thereon are substantially at the opposite ends of the length thereof.

4. The set of electronic articles of claim 1 wherein said dimensionally stable material includes one of a polyimide, a reinforced fiberglass and a liquid crystal polymer.

5. The set of electronic articles of claim 1 wherein the respective connections of the two contacts of said electronic jumper to the two contacts of the substrate; and/or of the two contacts of said electronic device to the two contacts of said electronic jumper comprise solder and/or electrically conductive adhesive.

6. The set of electronic articles of claim 1 wherein the electrical conductor on said substrate includes an elongated conductor providing an antenna, whereby said electronic article is a wireless article.

7. The set of electronic articles of claim 1 wherein said electronic jumper is connected to said substrate with said electronic device between said substrate and the jumper substrate.

8. The set of electronic articles of claim 1 wherein said electronic jumper is connected to said substrate with the jumper substrate between said electronic device and said substrate.

9. A set of electronic articles, wherein each electronic article need not be of the same size and/or shape, each electronic article comprising:
    an insulating substrate having an electrical conductor thereon, wherein the electrical conductor includes first and second contact sites spaced apart substantially a predetermined distance, wherein said insulating substrate need not be a dimensionally stable material;
    an insulating electronic circuit substrate having a length substantially the predetermined distance between first and second ends, having first and second contact sites substantially at the first and second ends, respectively, and having first and second terminals respectively connected to the first and second contact sites thereof, wherein said insulating electronic circuit substrate includes a dimensionally stable substrate material;
    an electronic device mounted to said insulating electronic circuit substrate and having first and second contacts respectively connected to the first and second terminals of said insulating electronic circuit substrate; and
    means for respectively electrically connecting the first and second contact sites of said insulating substrate and the first and second contact sites of said insulating electronic circuit substrate,
    whereby, for the insulating substrate of each article, the electronic device is on and connected to said insulating electronic circuit substrate which is on and connected to the electrical conductor of said insulating substrate.

10. The set of electronic articles of claim 9 wherein the electrical conductor on said insulating substrate includes an elongated conductor providing an antenna, whereby said electronic article is a wireless article.

11. The set of electronic articles of claim 9 wherein said dimensionally stable material includes one of a polyimide, a reinforced fiberglass and a liquid crystal polymer.

12. The set of electronic articles of claim 9 wherein said means for respectively electrically connecting comprises solder and/or electrically conductive adhesive.

13. The set of electronic articles of claim 9 wherein said insulating electronic circuit substrate is connected to said insulating substrate with said electronic device between said insulating substrate and the insulating electronic circuit substrate.

14. The set of electronic articles of claim 9 wherein said insulating electronic circuit substrate is connected to said insulating substrate with said insulating electronic circuit substrate between said electronic device and said insulating substrate.

15. A set of electronic circuits, each electronic circuit comprising:
    a rectangular insulating electronic circuit substrate having a predetermined length between first and second opposing ends;
    first and second elongated rectangular conductors on a surface of said rectangular insulating electronic circuit substrate separated by a gap, wherein said first elongated rectangular conductor has an end at the first end of said rectangular insulating electronic circuit substrate and said second elongated rectangular conductor has an end at the second end of said rectangular insulating electronic circuit substrate;
    a rectangular area of solder or electrically conductive adhesive disposed on each of the first and second elongated rectangular conductors of said insulating rectangular circuit substrate at the end thereof that is at an end of said rectangular insulating electronic circuit substrate, wherein each rectangular area of solder or electrically conductive adhesive has a cut edge at the end of said first and second elongated rectangular conductor at the end of said rectangular insulating electronic circuit substrate;

a rectangular terminal of solder or electrically conductive adhesive on each of said first and second elongated rectangular conductors adjacent the gap; and an electronic device mounted to said rectangular insulating electronic circuit substrate and having first and second contacts connected to the respective rectangular terminals of the first and second elongated rectangular conductors of said rectangular insulating electronic circuit substrate;

whereby the electronic device is on and connected to said elongated rectangular conductors of said rectangular insulating electronic circuit substrate.

16. The set of electronic circuits of claim 15 wherein said rectangular insulating electronic circuit substrate includes a dimensionally stable material.

17. The set of electronic circuits of claim 16 wherein said dimensionally stable material includes one of a polyimide, a reinforced fiberglass and a liquid crystal polymer.

18. The set of electronic circuits of claim 15 in combination with a set of article substrates, each of said article substrates having a conductor pattern including first and second terminals thereon, wherein each of said electronic circuits is attached to one of said article substrates, including means for respectively electrically connecting the rectangular areas of solder or electrically conductive adhesive of the first and second elongated rectangular conductors of each electronic circuit to the first and second terminals of said one article substrate.

19. The set of electronic circuits of claim 18 wherein said set of article substrates includes article substrates of different sizes and/or shapes, and wherein the first and second terminals of each of said article substrates are spaced apart substantially the predetermined distance.

20. The set of electronic circuits of claim 18 wherein the conductor pattern on said plurality of article substrates includes an elongated conductor providing an antenna, whereby said electronic circuit is a wireless article.

21. The set of electronic circuits of claim 18 wherein said rectangular insulating electronic circuit substrate is connected to said article substrate with said electronic device between said article substrate and the rectangular insulating electronic circuit substrate.

22. The set of electronic circuits of claim 18 wherein said rectangular insulating electronic circuit substrate is connected to said article substrate with said rectangular insulating electronic circuit substrate between said electronic device and said article substrate.

23. A set of electronic articles comprising:

a plurality of article substrates each having an electrical conductor thereon, wherein ones of said plurality of article substrates may be of different size than other ones of said plurality of article substrates, wherein the electrical conductor of each of said plurality of article substrates includes first and second contact sites spaced apart substantially a predetermined distance;

on each of said plurality of article substrates:

an electronic circuit substrate having a length substantially the predetermined distance between first and second ends thereof and having first and second contact sites substantially at the first and second ends thereof, respectively;

an electronic device mounted to said electronic circuit substrate and having at least two contacts respectively connected to the first and second contact sites of said electronic circuit substrate; and means for electrically connecting the first and second contact sites of each of said plurality of article substrates and the first and second contact sites of one electronic circuit substrate, whereby for each article substrate of said plurality of article substrates the electronic device is on and connected to said electronic circuit substrate which is on and connected to the electrical conductor of said article substrate.

24. The set of electronic articles of claim 23 wherein said electronic circuit substrate includes a dimensionally stable material.

25. The set of electronic articles of claim 24 wherein said dimensionally stable material includes one of a polyimide, a reinforced fiberglass and a liquid crystal polymer.

26. The set of electronic articles of claim 23 wherein said means for electrically connecting comprises solder and/or electrically conductive adhesive.

27. The set of electronic articles of claim 23 wherein the electrical conductor on said plurality of article substrates includes an elongated conductor providing an antenna, whereby said electronic circuit is a wireless article.

28. The set of electronic articles of claim 23 wherein said electronic circuit substrate is connected to said article substrate with said electronic device between said article substrate and said electronic circuit substrate.

29. The set of electronic articles of claim 23 wherein said electronic circuit substrate is connected to said article substrate with said electronic circuit substrate between said electronic device and said article substrate.

30. A set of electronic articles, wherein each electronic article need not be of the same size and/or shape, each electronic article comprising:

an insulating tag substrate having an elongated electrical conductor providing an antenna thereon, wherein the electrical conductor includes first and second contact sites spaced apart substantially a predetermined distance, and wherein said insulating tag substrate is of a material that is not dimensionally stable;

an insulating jumper circuit substrate having a length substantially the predetermined distance between first and second ends and having an electrical conductor therebetween on one surface thereof, and having first and second contact sites substantially at the first and second ends, respectively;

wherein said insulating jumper circuit substrate is of a substrate material that is dimensionally stable;

an electronic device mounted to one of said insulating tag substrate and said insulating electronic jumper circuit substrate and having first and second contacts respectively connected at opposing sides of a gap in one of the elongated electrical conductor of said insulating tag substrate or the electrical conductor of said insulating electronic jumper circuit substrate; and means for respectively electrically connecting the first and second contact sites of said insulating tag substrate and the first and second contact sites of said insulating electronic jumper circuit substrate at the first and second ends of said insulating jumper circuit substrate with the one surface thereof distal the insulating tag substrate;

whereby the electronic device is operatively connected to the antenna of said insulating tag substrate and said electronic article is a wireless article.

31. The set of electronic articles of claim 30 wherein said insulating jumper circuit substrate is connected to said insulating tag substrate with said electronic device between said insulating jumper circuit substrate and said insulating tag substrate.

32. The set of electronic articles of claim 30 wherein said insulating jumper circuit substrate is connected to said insulating tag substrate with said insulating jumper circuit substrate between said electronic device and said insulating tag substrate.

33. A set of electronic circuits, each electronic circuit comprising:
- a dimensionally-stable insulating electronic circuit substrate having a predetermined length between first and second opposing ends;
- first and second elongated rectangular conductors on a surface of said dimensionally-stable insulating electronic circuit substrate separated by a gap, wherein said first elongated rectangular conductor has an end at the first end of said dimensionally-stable insulating electronic circuit substrate and said second elongated rectangular conductor has an end at the second end of said dimensionally-stable insulating electronic circuit substrate;
- a rectangular area of solder or electrically conductive adhesive disposed on each of the first and second elongated rectangular conductors of said dimensionally-stable insulating circuit substrate at the end thereof that is at an end of said dimensionally-stable insulating electronic circuit substrate, wherein each rectangular area of solder or electrically conductive adhesive has a cut edge at the end of said first and second elongated rectangular conductor that is at the end of said dimensionally-stable insulating electronic circuit substrate;
- a rectangular terminal of solder or electrically conductive adhesive on each of said first and second elongated rectangular conductors adjacent the gap therebetween; and
- an electronic device mounted to said dimensionally-stable insulating electronic circuit substrate and having first and second contacts connected to the respective rectangular terminals of the first and second elongated rectangular conductors of said dimensionally-stable insulating electronic circuit substrate;
- whereby the electronic device is on and connected to said elongated rectangular conductors of said dimensionally-stable insulating electronic circuit substrate.

34. A set of electronic circuits, each electronic circuit comprising:
- a dimensionally-stable insulating electronic circuit substrate having a predetermined length between first and second opposing ends;
- first and second elongated conductors on a surface of said dimensionally-stable insulating electronic circuit substrate separated by a gap, wherein said first elongated conductor has an end at the first end of said dimensionally-stable insulating electronic circuit substrate and said second elongated conductor has an end at the second end of said dimensionally-stable insulating electronic circuit substrate;
- an area of solder or electrically conductive adhesive disposed on each of the first and second elongated conductors of said dimensionally-stable insulating circuit substrate at the end thereof that is at an end of said dimensionally-stable insulating electronic circuit substrate, wherein each area of solder or electrically conductive adhesive has a cut edge at the end of said first and second elongated conductor that is at the end of said dimensionally-stable insulating electronic circuit substrate;
- a terminal of solder or electrically conductive adhesive on each of said first and second elongated conductors proximate the gap therebetween; and
- an electronic device mounted to said dimensionally-stable insulating electronic circuit substrate and having first and second contacts connected to the respective terminals of the first and second elongated conductors of said dimensionally-stable insulating electronic circuit substrate;
- whereby the electronic device is on and connected to said elongated conductors of said dimensionally-stable insulating electronic circuit substrate.

35. A set of electronic articles comprising:
- a plurality of article substrates each having an electrical conductor thereon, wherein ones of said plurality of article substrates may be of different size than other ones of said plurality of article substrates, wherein the electrical conductor of each of said plurality of article substrates includes first and second contact sites spaced apart substantially a predetermined distance, and wherein said article substrates are not dimensionally stable;
- on each of said plurality of article substrates:
  - a dimensionally-stable electronic circuit substrate having a length substantially the predetermined distance between first and second ends thereof, and having first and second contact sites substantially at the first and second ends thereof, respectively;
  - an electronic device mounted to said dimensionally-stable electronic circuit substrate and having at least two contacts respectively connected to the first and second contact sites of said dimensionally-stable electronic circuit substrate; and
  - solder or electrically conductive adhesive electrically connecting the first and second contact sites of each of said plurality of article substrates and the first and second contact sites of one dimensionally-stable electronic circuit substrate, respectively,
- whereby for each article substrate of said plurality of article substrates the electronic device is on and connected to said dimensionally-stable electronic circuit substrate which is on and connected to the electrical conductor of said article substrate.

* * * * *